(12) United States Patent
Li

(10) Patent No.: US 7,682,977 B2
(45) Date of Patent: Mar. 23, 2010

(54) METHODS OF FORMING TRENCH ISOLATION AND METHODS OF FORMING ARRAYS OF FLASH MEMORY CELLS

(75) Inventor: Li Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 11/433,324

(22) Filed: May 11, 2006

(65) Prior Publication Data

US 2007/0264794 A1    Nov. 15, 2007

(51) Int. Cl.
*H01L 21/311* (2006.01)

(52) U.S. Cl. .................. 438/700; 438/704; 438/697; 438/623; 438/725; 438/780; 438/789; 438/790; 438/619; 257/642; 257/759; 257/791; 257/E39.007; 257/E51.001; 257/E51.007; 257/E21.261

(58) Field of Classification Search ............. 257/642, 257/759, 791, E39.007, E51.001, E51.007, 257/E21.261; 438/700, 704, 697, 623, 725, 438/780, 789, 790, 619
See application file for complete search history.

(56) References Cited

U.S. PATENT DOCUMENTS

| | | | |
|---|---|---|---|
| 3,990,927 A | 11/1976 | Montier | |
| 4,474,975 A | 10/1984 | Clemons et al. | |
| 5,156,881 A | 10/1992 | Okano et al. | |
| 5,182,221 A | 1/1993 | Sato | |
| 5,354,421 A * | 10/1994 | Tatsumi et al. | 438/695 |
| 5,410,176 A | 4/1995 | Liou et al. | |
| 5,470,798 A | 11/1995 | Ouellet | |
| 5,719,085 A | 2/1998 | Moon et al. | |
| 5,741,740 A | 4/1998 | Jang et al. | |
| 5,770,469 A | 6/1998 | Uram et al. | |
| 5,776,557 A | 7/1998 | Okano et al. | |
| 5,786,039 A | 7/1998 | Brouquet | |

(Continued)

FOREIGN PATENT DOCUMENTS

JP    402277253 A    11/1990

(Continued)

OTHER PUBLICATIONS

Beekmann et al., *Sub-micron Gap Fill and In-Sutu Planarisation Using Flowfill™ Technology*, Electrotech, pp. 1-7 (Oct. 1995).

(Continued)

*Primary Examiner*—Fernando L Toledo
*Assistant Examiner*—Ankush k Singal
(74) *Attorney, Agent, or Firm*—Wells St. John P.S.

(57) ABSTRACT

This invention includes methods of forming trench isolation. In one implementation, isolation trenches are provided within a semiconductor substrate. A liquid is deposited and solidified within the isolation trenches to form a solidified dielectric within the isolation trenches. The dielectric comprises carbon and silicon, and can be considered as having an elevationally outer portion and an elevationally inner portion within the isolation trenches. At least one of carbon removal from and/or oxidation of the outer portion of the solidified dielectric occurs. After such, the dielectric outer portion is etched selective to and effective to expose the dielectric inner portion. After the etching, dielectric material is deposited over the dielectric inner portion to within the isolation trenches.

30 Claims, 11 Drawing Sheets

U.S. PATENT DOCUMENTS

| | | | |
|---|---|---|---|
| 5,801,083 | A | 9/1998 | Yu et al. |
| 5,863,827 | A | 1/1999 | Joyner |
| 5,883,006 | A | 3/1999 | Iba |
| 5,888,880 | A | 3/1999 | Gardner et al. |
| 5,895,253 | A | 4/1999 | Akram |
| 5,904,540 | A | 5/1999 | Sheng et al. |
| 5,915,180 | A * | 6/1999 | Hara et al. ............... 438/270 |
| 5,930,645 | A | 7/1999 | Lyons et al. |
| 5,943,585 | A | 8/1999 | May et al. |
| 5,950,094 | A | 9/1999 | Lin et al. |
| 5,960,299 | A | 9/1999 | Yew et al. |
| 5,972,773 | A | 10/1999 | Liu et al. |
| 5,998,280 | A | 12/1999 | Bergemont et al. |
| 6,030,881 | A | 2/2000 | Papasouliotis et al. |
| 6,051,447 | A | 4/2000 | Nam |
| 6,057,580 | A * | 5/2000 | Watanabe et al. ........... 257/396 |
| 6,156,674 | A * | 12/2000 | Li et al. ............... 438/780 |
| 6,300,219 | B1 | 10/2001 | Doan et al. |
| 6,376,391 | B1 * | 4/2002 | Olson et al. ............. 438/758 |
| 6,455,394 | B1 * | 9/2002 | Iyer et al. ............. 438/428 |
| 6,531,377 | B2 * | 3/2003 | Knorr et al. ............ 438/435 |
| 6,596,607 | B2 * | 7/2003 | Ahn .................... 438/424 |
| 6,798,038 | B2 * | 9/2004 | Sato et al. .............. 257/510 |
| 6,888,212 | B2 * | 5/2005 | Iyer et al. .............. 257/506 |
| 6,939,817 | B2 * | 9/2005 | Sandhu et al. ........... 438/789 |
| 7,018,905 | B1 * | 3/2006 | Yang .................... 438/424 |
| 7,078,352 | B2 * | 7/2006 | Beyer et al. ............. 438/739 |
| 7,205,248 | B2 * | 4/2007 | Li et al. ............... 438/788 |
| 7,217,654 | B2 * | 5/2007 | Nagahara et al. .......... 438/637 |
| 7,241,694 | B2 * | 7/2007 | Takeuchi et al. .......... 438/700 |
| 2002/0081855 | A1 * | 6/2002 | Jiang et al. ............. 438/694 |
| 2003/0027401 | A1 * | 2/2003 | Iyer et al. .............. 438/400 |
| 2003/0077916 | A1 * | 4/2003 | Xu et al. ............... 438/778 |
| 2003/0170993 | A1 * | 9/2003 | Nagahara et al. .......... 438/694 |
| 2004/0152342 | A1 * | 8/2004 | Li et al. ............... 438/789 |
| 2005/0124168 | A1 * | 6/2005 | Nagahara et al. .......... 438/745 |
| 2005/0227451 | A1 * | 10/2005 | Konno et al. ............. 438/424 |
| 2006/0097268 | A1 * | 5/2006 | Kumar et al. ............. 257/77 |
| 2006/0128149 | A1 * | 6/2006 | Kim ..................... 438/669 |
| 2006/0177990 | A1 * | 8/2006 | Beyer et al. ............. 438/421 |
| 2006/0216937 | A1 * | 9/2006 | Dunton et al. ............ 438/692 |
| 2007/0096331 | A1 * | 5/2007 | Nagahara et al. .......... 257/774 |

FOREIGN PATENT DOCUMENTS

| | | |
|---|---|---|
| JP | 0146224 | 1/1996 |

OTHER PUBLICATIONS

Hone et al., Kinetics and Mechanism of the Reactions of $O(_3P)$ with $SiH_4$, $CH_3SiH_3$, $(CH_3)_2SiH_2$, and $(CH_3)_3SiH$, 95 J. Phys. Chem. 4393-4400 (1991).

Joshi, et al., *Plasma Deposited Organosilicon Hydride Network Polymers as Versatile Resists for Entirely Dry Mid-Deep UV Photolithography*, 1925 SPIE, 709-720 (Jan. 1993).

Kiermasz et al., *Planarisation for Sub-Micron Devices Utilising a New Chemistry*, 2 pp. (Feb. 1995).

Kojima et al., *Planarization Process Using a Multi-Coating of Spin-on-Glass*, IEEE, V-MIC Conf. (Jun. 13-14, 1988).

Matsuura et al., *A Highly Reliable Self-planarizing Low-k Intermetal Dielectric for Sub-quarter Micron Interconnects*, IEEE, pp. 785-788 (Jul. 1997).

Matsuura et al., *Novel Self-planarizing CVD Oxide for Interlayer Dielectric Applications*, IEEE, pp. 117-120 (1994).

McClatchie et al., *Low Dielectric Constant Flowfill™ Technology for IMD Applications*, 7 pp. (pre-Aug. 1999).

Witnall et al. *Matrix Reactions of Methylsilanes and Oxygen Atoms*, 92 J. Phys. Chem. pp.594-602 (1988).

Heo, Jin-Hwa, "*Void Free and Low Stress Shallow Trench Isolation Technology using P-SOG for sub 0.1 μm Device*", 2002 Symposium On VLSI Technology Digest of Technical Papers, 2002 IEEE, pp. 132-133.

Loboda, Mark J., "*Understanding hydrogen silsesquioxane-based dielectric film processing*", http://solidstate.archives.printthis.clickability.com, pp. 1-7.

\* cited by examiner

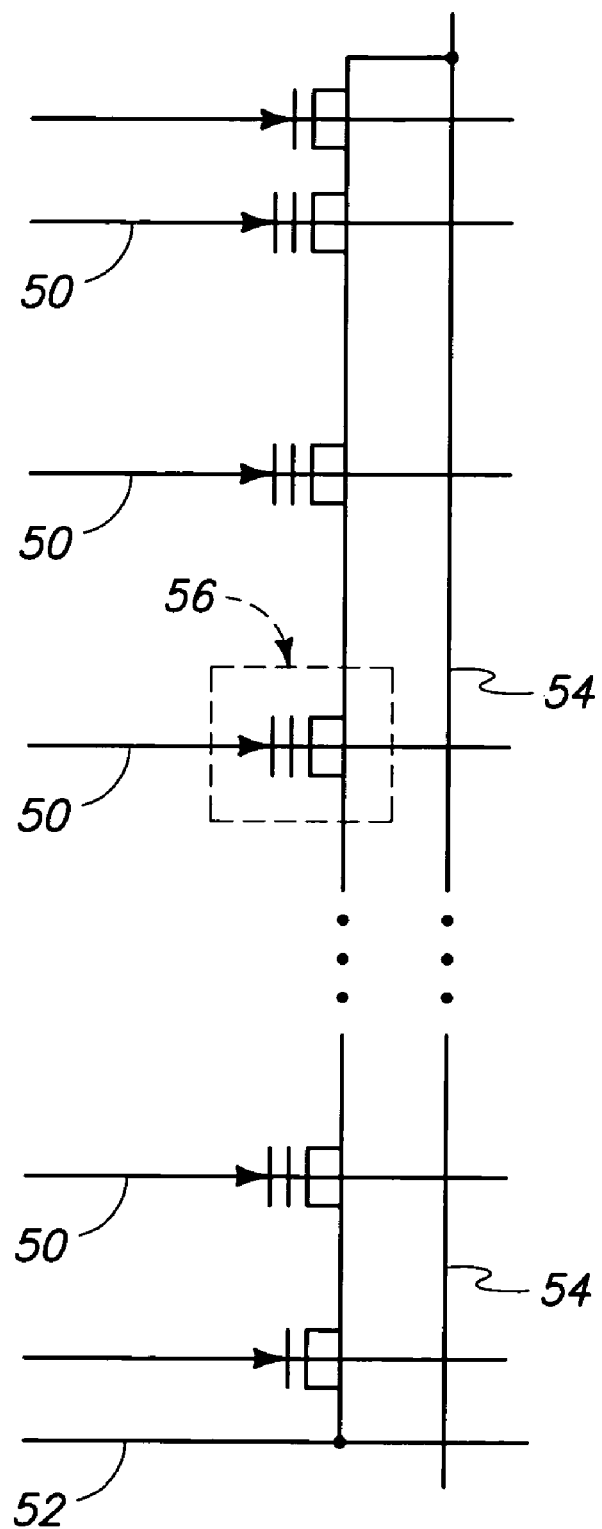

METHODS OF FORMING TRENCH ISOLATION AND METHODS OF FORMING ARRAYS OF FLASH MEMORY CELLS

TECHNICAL FIELD

This invention relates to methods of forming trench isolation and to methods of forming arrays of FLASH memory cells.

BACKGROUND OF THE INVENTION

Integrated circuits are typically formed from numerous devices packed into small areas of a semiconductor substrate. For the circuitry to function, many of these individual devices need to be electrically isolated from one another. Accordingly, electrical isolation is an integral part of semiconductor device design for preventing the unwanted electrical leaking and coupling between adjacent components and devices.

As the size of integrated circuits is reduced, the devices that make up the circuits must be positioned closer together in order to comply with the limited space available on a typical semiconductor substrate. As the industry strives toward greater density of active components per unit area of a semiconductor substrate, effective isolation between circuits becomes increasingly important. One conventional method of isolating circuit components in modern integrated circuit technology takes the form of trench isolation regions which are etched into semiconductor substrates and filled with insulating material. While device geometries have tended to shrink in the horizontal dimension, electronic devices and isolation trenches in some instances have increased in the vertical dimension. Accordingly, it is a challenge to be able to adequately fill deep and narrow isolation trenches with dielectric material.

One existing technique of filling isolation trenches includes initially filling the trenches with a liquid spin-on-dielectric material, for example a carbon-free polysilazane. These and other spin-on-dielectrics typically deposit to completely fill isolation trenches, thereby resulting in a typically desired void-free filled trench. Unfortunately, many spin-on-dielectrics do not have the desired solidified dielectric properties for the electrical isolating function in the finished circuitry, and/or are not sufficiently dense to adequately resist subsequent selective wet etching of other material(s). Yet, many of the dielectric materials that do have the desired finished dielectric properties cannot be deposited conformally or effective to desirably fill very deep and narrow trenches. Accordingly, one prior art technique of forming trench isolation is to initially deposit a spin-on-dielectric to completely fill deep and narrow isolation trenches over a substrate. Such material is then etched back to leave the lowest portion of the trenches filled with dielectric material and the upper portions outwardly exposed. These upper exposed portions can then be filled with dielectric material having more preferred electrical characteristics.

Unfortunately, the typical etch back of the dielectric material to remove such from the upper portion of the trenches is a timed etch which does not consistently remove the same amount of material from each of the trenches. Thereby, subsequently deposited desired dielectric material is provided in different trenches to different depths and thicknesses which can lead to unpredictable isolation and circuit operation.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 11 is a schematic representation of exemplary circuitry fabricated in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Exemplary implementations of methods of forming trench isolation are described, by way of examples only, with reference to FIGS. 1-11. An exemplary preferred described method of forming such is in the context of forming an array of FLASH memory cells, and particularly in forming floating gate transistors of NAND unit cells of an array of NAND memory circuitry intermediate adjacent pairs of isolation trenches. However, aspects of the invention also contemplate forming trench isolation independent of floating gate or FLASH. memory cell fabrication, and of course, further contemplate the fabrication of integrated circuitry comprising floating gates which might be employed in non-memory circuitry, and further, independent of whether existing or yet-to-be developed.

Figure 1:
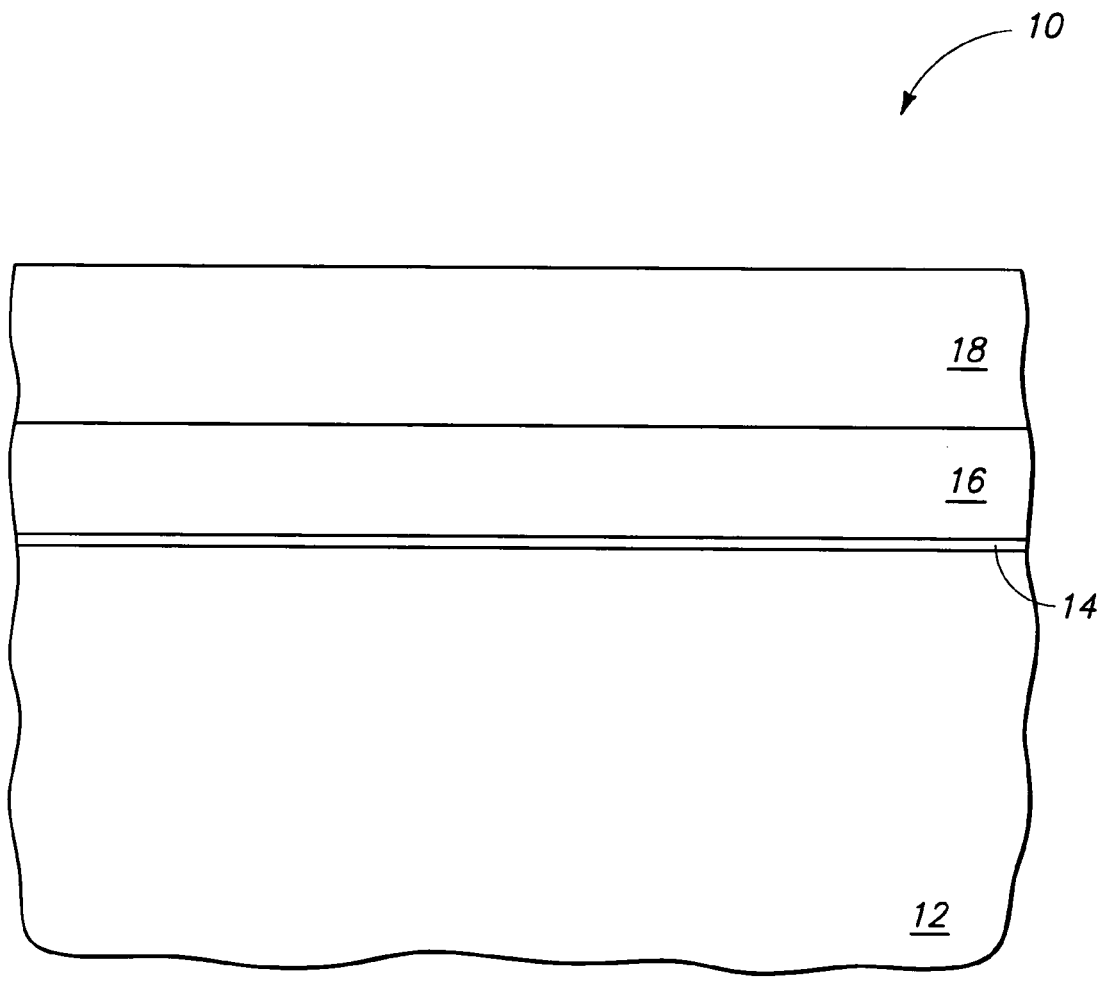
FIG. 1 is a diagrammatic cross section of a semiconductor substrate in process in accordance with an aspect of the invention.

FIG. 1 depicts a semiconductor substrate generally indicated with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Semiconductor substrate 10 is depicted as comprising a bulk substrate 12, for example bulk monocrystalline silicon of suitable background or other well doping, or being undoped. Semiconductor-on-insulator substrates are also contemplated, and whether existing or yet-to-be developed.

A gate dielectric 14 has been formed over substrate material 12. An exemplary material is thermally grown silicon dioxide of an exemplary thickness of from 10 Angstroms to 100 Angstroms. Of course, gate dielectric 14 might comprise one or more different materials and/or layers. Floating gate material 16 has been formed over gate dielectric 14. An exemplary material is polysilicon deposited to an exemplary thickness of from 50 Angstroms to 1,000 Angstroms. Such is preferably suitably conductively doped to function as a floating gate, although such might alternately or additionally be doped in subsequent processing. Further of course, layer 16 might comprise a combination of different materials and/or layers.

Trench isolation masking material 18 has been formed over floating gate material 16. By way of example only, such is preferred to function as an essential hardmask in forming of isolation trenches as is described below. Masking material 18 might comprise one or more different layers and/or materials, with silicon nitride being but one example, and with an exemplary thickness being from 100 Angstroms to 2,000 Angstroms.

Figure 2:
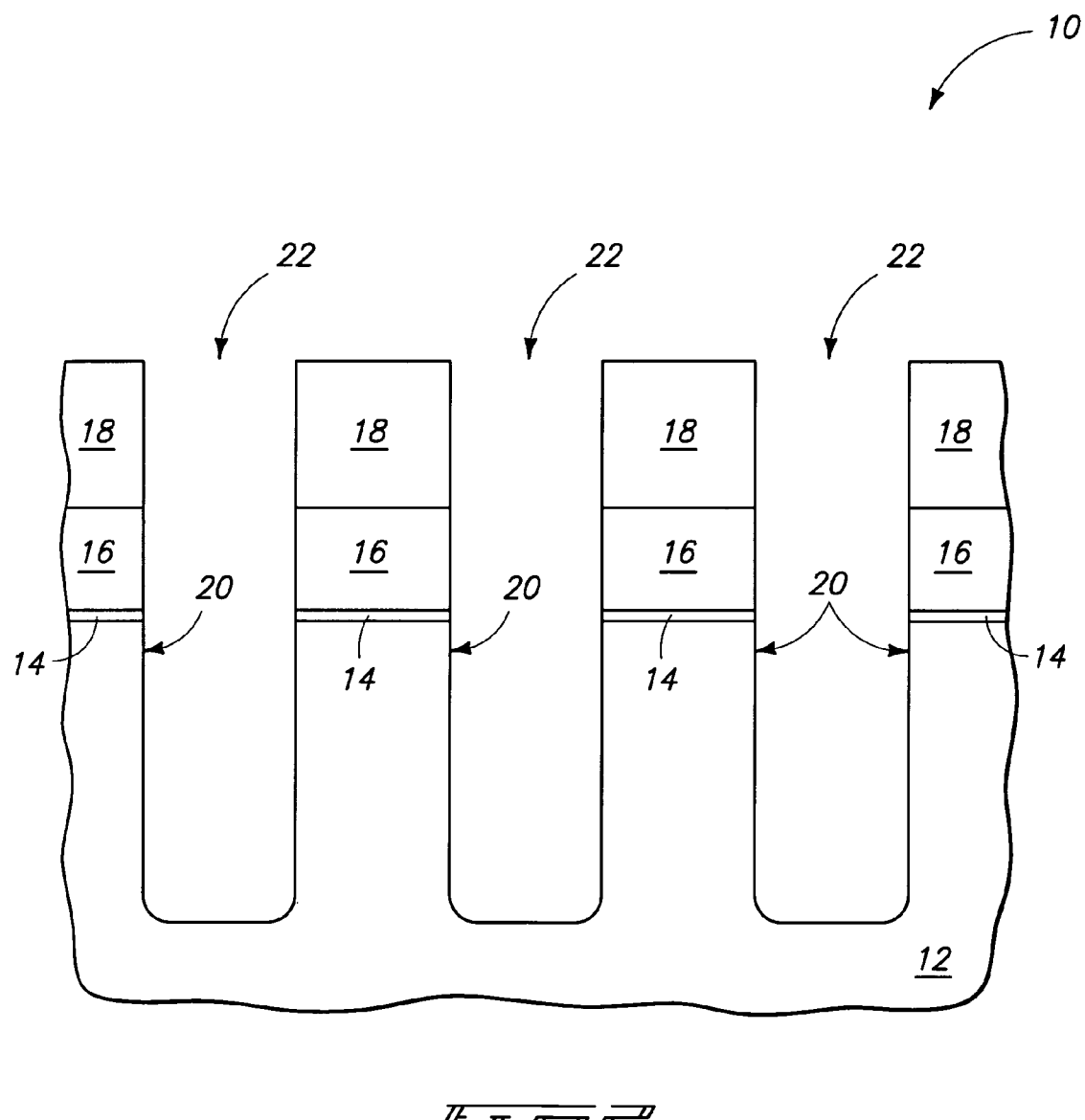
FIG. 2 is a view of the FIG. 1 substrate at a processing subsequent to that depicted by FIG. 1.
Figure 3:
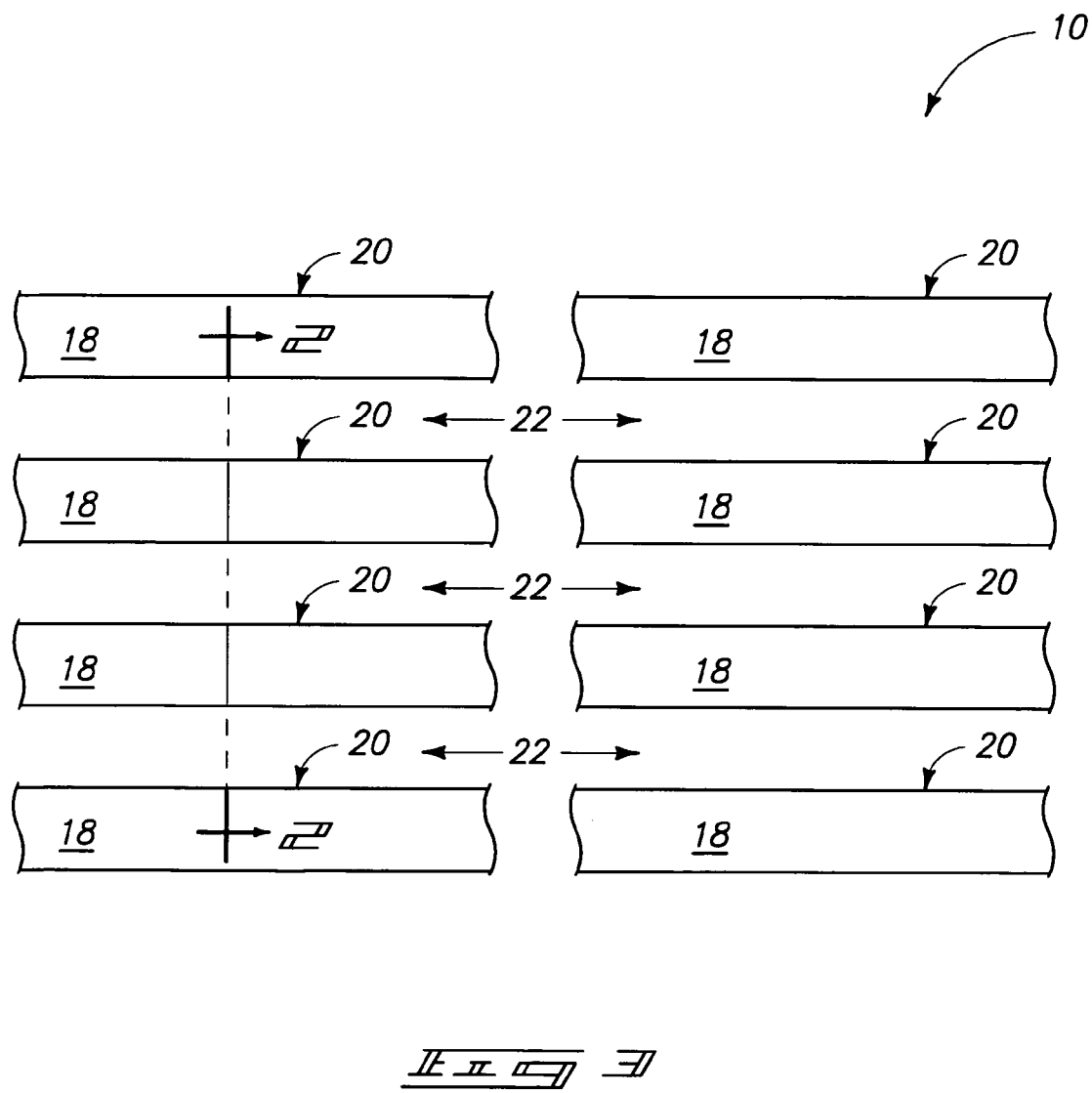
FIG. 3 is a top view of the FIG. 2 substrate.

Referring to FIGS. 2 and 3, a series of alternating active area rows 20 and isolation trenches 22 have been formed using trench isolation masking material 18 as a mask. By way of example only, a preferred technique for doing so includes photolithographic patterning and etch, for example utilizing photoresist (not shown) outwardly of masking material 18. In the depicted preferred embodiment, active area rows 20 have gate dielectric 14 and floating gate material 16 thereover. By way of example only, such provides but one exemplary method of providing isolation trenches within a semiconductor substrate. Alternate methods and alternate semiconductor substrates 10 are of course also contemplated, for example as referred to above.

Figure 4:
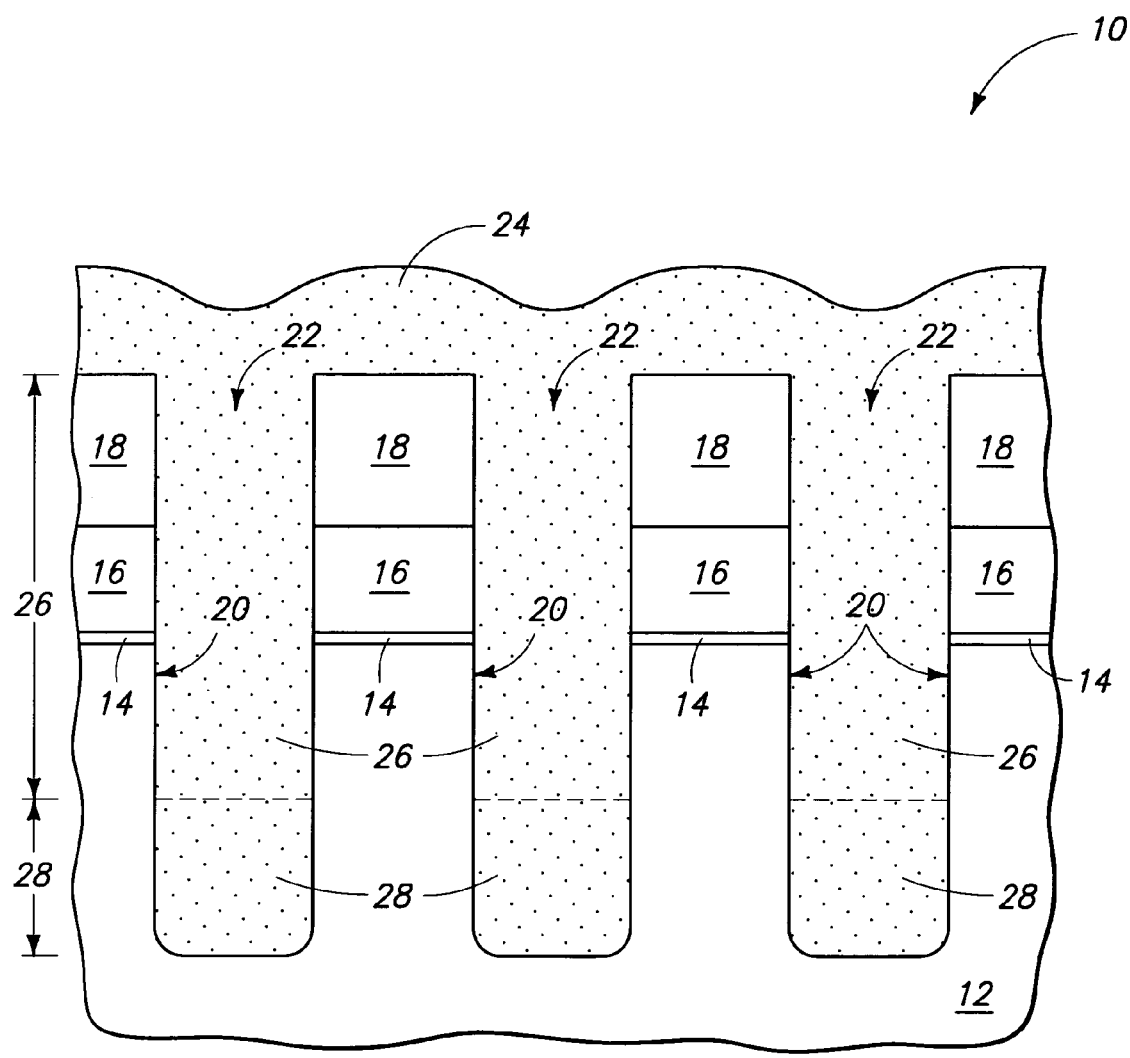
FIG. 4 is a view of the FIG. 2 substrate at a processing subsequent to that depicted by FIG. 2.

Referring to FIG. 4, a liquid has been deposited and solidified within isolation trenches 22 to form a solidified dielectric 24 within isolation trenches 22. Dielectric 24 comprises carbon and silicon, and can be considered also as comprising an elevationally outer portion 26 and an elevationally inner portion 28 within isolation trenches 22. Preferably, the carbon content in solidified dielectric 24 is from 5 atomic percent to 70 atomic percent, and more preferably from 20 atomic percent to 40 atomic percent. In one preferred implementation, the silicon content in solidified dielectric 24 is from 10 atomic percent to 90 atomic percent, more preferably from 20 atomic percent to 60 atomic percent, and even more preferably from 30 atomic percent to 40 atomic percent. The liquid from which solidified dielectric 24 is formed might also comprise at least one of nitrogen and oxygen (and of course, including both). If present, an exemplary preferred content of the at least one of nitrogen and/or oxygen is from 10 atomic percent to 70 atomic percent, with from 20 atomic percent to 40 atomic percent being more preferred.

One most-preferred and reduction-to-practice liquid comprises an organosiloxane. One exemplary organosiloxane is Silecs 28E available from Silecs, Inc. of Mountainview, Calif., and which is understood to comprise an organosiloxane containing about 35 atomic percent carbon. Other organosiloxanes are also contemplated, for example and by way of example only, methyl silsesquioxane. Carbon and silicon-containing dielectrics other than organosiloxanes are also contemplated, for example silicate polymers. Deposition and solidification of material 24 is preferably sufficient or effective to fill, and overfill, isolations 22, for example as shown. The liquid material from which solidified dielectric 24 is formed might be deposited by any existing or yet-to-be developed manner(s). For example, such might be applied over a spinning substrate 10, or a stationary substrate 10. Spin-on and other liquid dielectrics typically go on as liquids, for example at room temperature. Those which contain solvent typically rapidly evaporate at least some of the solvent to quickly leave a solid film on the substrate. Such might be subjected to various heating/baking steps, and subsequent heat or other treatments at different temperatures and/or for different times.

Figure 5:
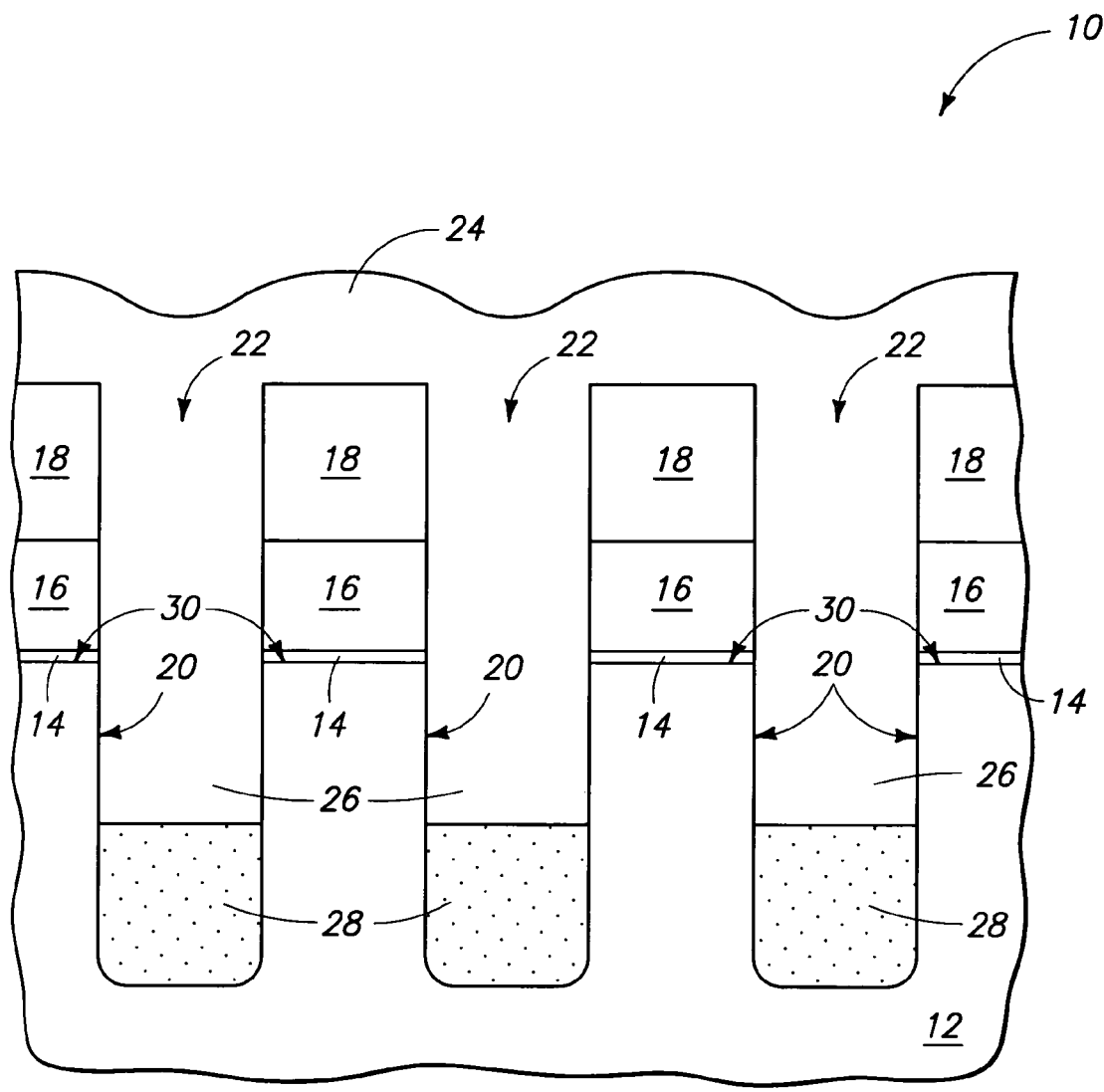
FIG. 5 is a view of the FIG. 4 substrate at a processing subsequent to that depicted by FIG. 4.

Referring to FIG. 5, solidified dielectric 24 has been treated effective to at least one of remove carbon and/or oxidize outer portion 26 of solidified dielectric 24. Preferably when carbon is removed, such is removed from outer portion 26 to leave no more than 5 atomic percent, more preferably no more than 2.5 atomic percent, more preferably no more than 1.0 atomic percent, and even more preferably no more than 0.5 atomic percent, carbon in outer portion 26. Most preferably, no detectable carbon remains in outer portion 26 at the conclusion of the treating. In one preferred implementation, the treating or removing action comprises exposure to an oxygen-containing material. For example, such might be by an oxygen-containing plasma treatment, a vapor phase treatment in the presence of an oxygen-containing gas in the absence of plasma, exposure to an oxygen-containing liquid, some combination of the above, or any other existing or yet-to-be developed method which has the effect of one or both of removing carbon and/or oxidizing an exemplary outer portion 26 of solidified material 24. In exemplary preferred implementations, the oxygen-containing material might comprise at least one of $O_2$, $O_3$, NO, $N_2O$, $NO_2$, $H_2O_2$, and $H_2O$.

By way of example only, FIG. 5 depicts some changed attribute to outer portion 26 by at least one of carbon removal and/or oxidization in comparison to FIG. 4 depicted by removal of the stippling in FIG. 5 from outer portion 26. By way of example only, an exemplary preferred treatment is using an $O_2$-comprising plasma, for example in a single wafer processor at a chamber pressure of from 1 mTorr to 200 Torr, with 1 Torr being a specific example. By way of example only, the substrate temperature might be anywhere from room temperature to 500° C., with 110° C. being a specific example. Exemplary $O_2$ flow to the chamber is from 1 sccm to 20,000 sccm, with 5,580 being a specific reduction-to-practice example, and wherein an additional 420 sccm of an inert $H_2$ and $N_2$ mixture was also flowed. Such treatment also oxidized outer portion 26. Regardless, the time of treatment will determine the depth of carbon removal and/or oxidation, thereby in one implementation by the treating essentially defining the ultimate interface between outer portion 26 and inner portion 28 of solidified dielectric 24. In one exemplary preferred embodiment, semiconductive material 12 of substrate 10 can be considered as having an outermost surface 30, with the depicted exemplary dashed interface defining outer portion 26 and inner portion 28 preferably being from 50 Angstroms to 3,000 Angstroms deep within semiconductor substrate material 12 relative to outermost surface 30, with from 500 Angstroms to 700 Angstroms being more preferred. However, such is, of course, optimizable by the artisan. Further and for example, the depth of inner portion 28 as a percent of the trench depth below the outer surface 30 can be selectable by the artisan depending upon the desired finished dielectric composition and typical preferred capability of conformally depositing a subsequent dielectric layer to likely completely fill the isolation trenches.

Figure 6:
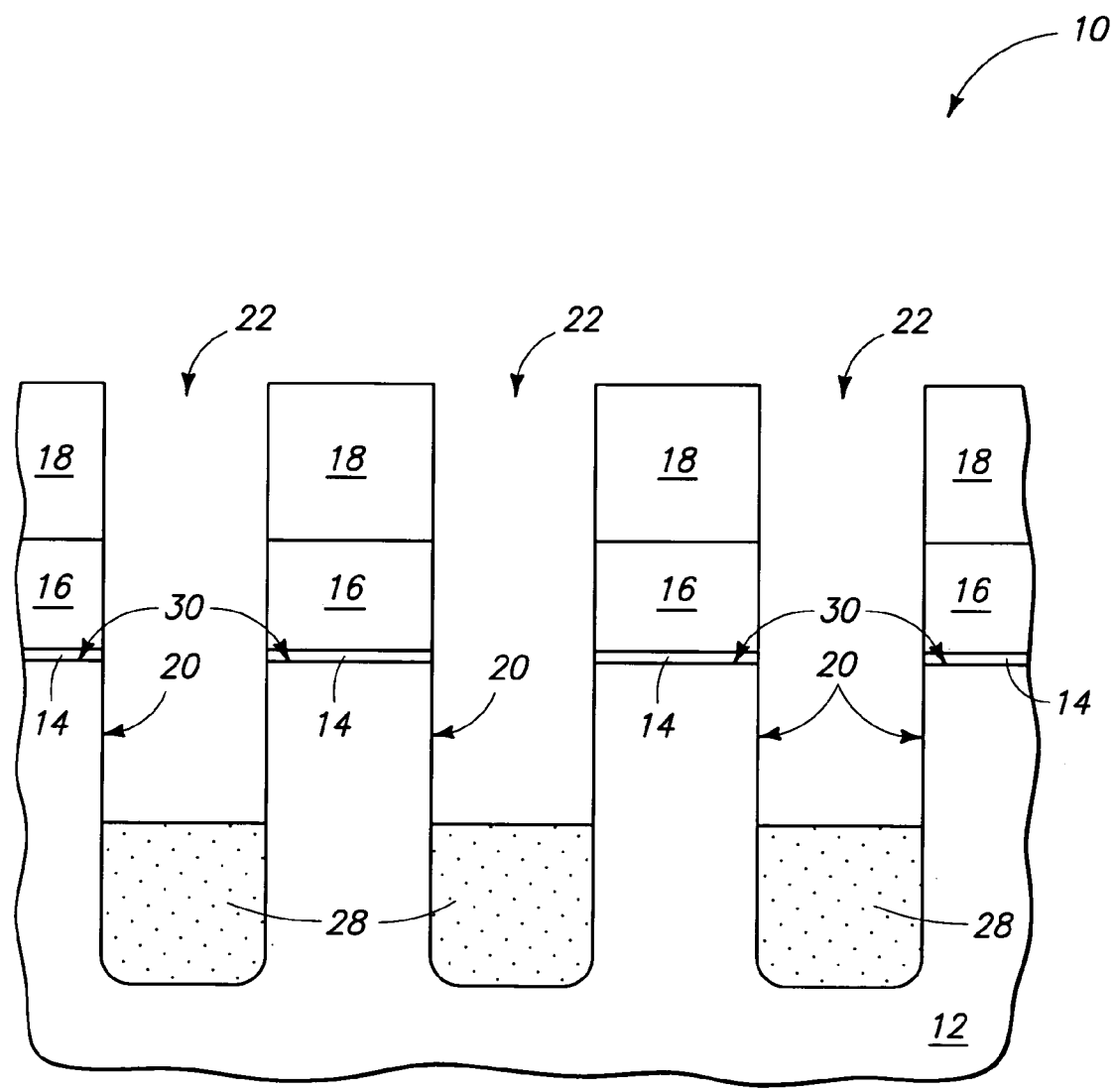
FIG. 6 is a view of the FIG. 5 substrate at a processing subsequent to that depicted by FIG. 5.

Referring to FIG. 6, dielectric outer portion 26 of solidified dielectric 24 has been etched selective to and effective to expose dielectric inner portion 28. In the context of this document, a selective etch requires the removal of one material relative to another at a rate of at least 2:1. The etching might comprise wet etching, dry etching, or a combination of wet and dry etching. An exemplary and preferred etching comprises wet etching with an aqueous HF-comprising solution. Temperature, time, etching chemistry, etc., can be optimized by the artisan. The invention was reduced-to-practice utilizing a 100:1 volume percent solution of water:HF, where the designated HF was 49 weight percent HF in water. The pressure during etching was room ambient, and the temperature of the etching solution was 21.5° C. An exemplary dry etching chemistry includes a combination of $C_4F_6$, Ar, and $O_2$, and for example with or without the use of plasma, and whether generated within or remote from the chamber.

Etching selectivity of the dielectric outer portion relative to the dielectric inner portion is preferably at a selectivity ratio of at least 5:1 upon exposure of the dielectric inner portion, and even more preferably at a selectivity ratio of at least 100:1 upon exposure of the dielectric inner portion. The above exemplary reduction-to-practice example is believed to have achieved a selectivity ratio of at least 500:1 upon exposure of the dielectric inner portion.

Figure 7:
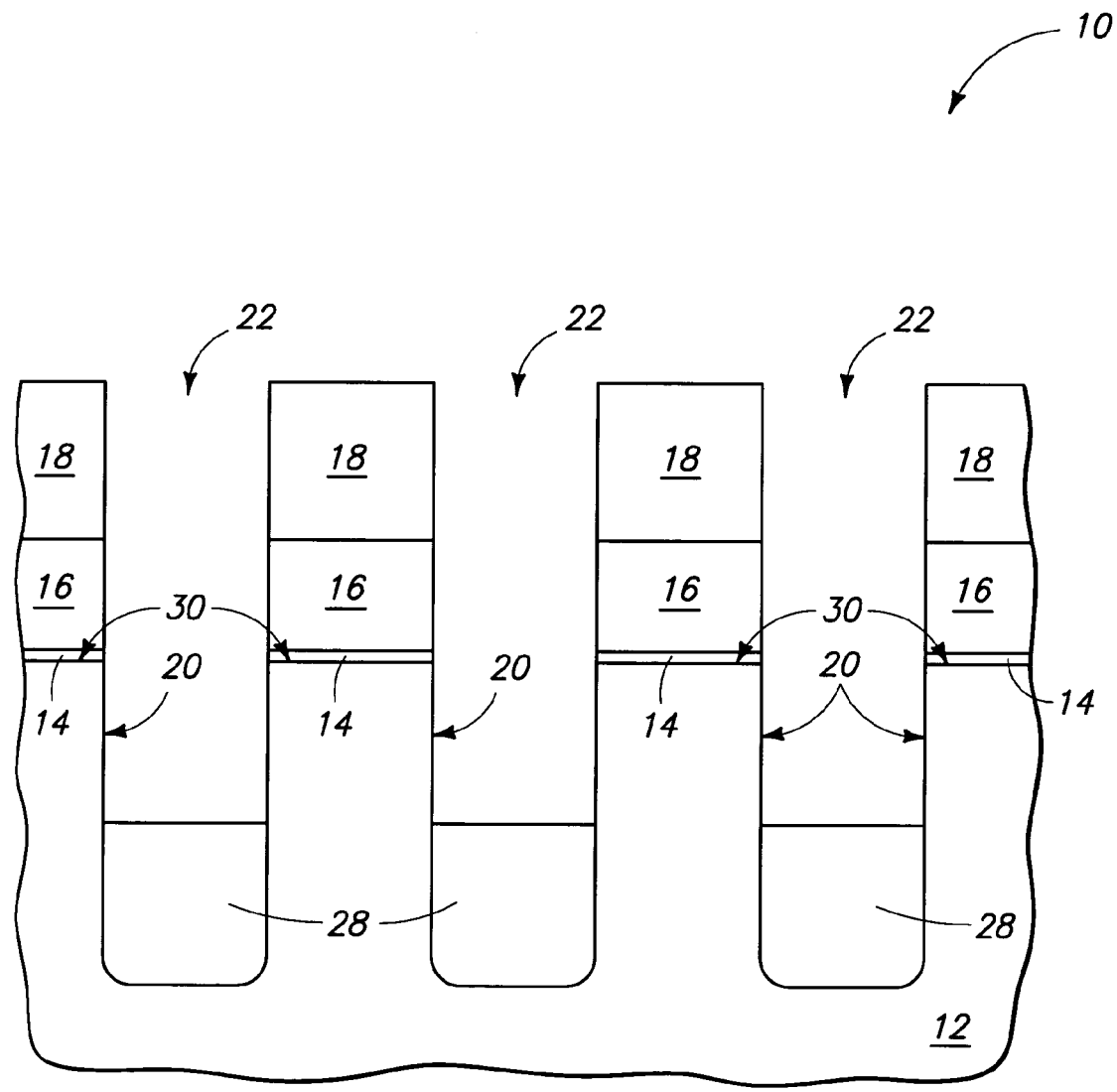
FIG. 7 is a view of the FIG. 6 substrate at a processing subsequent to that depicted by FIG. 6.

Referring to FIG. 7, and after the etching, carbon is preferably removed from inner portion 28 of dielectric 24. Such removing might also oxidize inner portion 28. At least some removal of carbon from inner portion 28 is preferred and desirable in most applications, as carbon is typically not a preferred component in the trench isolation dielectric of the finished circuitry construction. When removed, carbon removal from inner portion 28 is preferably to an extent to leave no more than 5 atomic percent, more preferably no more than 2.5 atomic percent, and even more preferably no more than 0.5 atomic percent, carbon in inner portion 28. In certain preferred implementations where carbon is removed from inner portion 28, no detectable carbon remains. Treatment might occur by any of the techniques described above for removing carbon from outer portion 26.

Figure 8B:
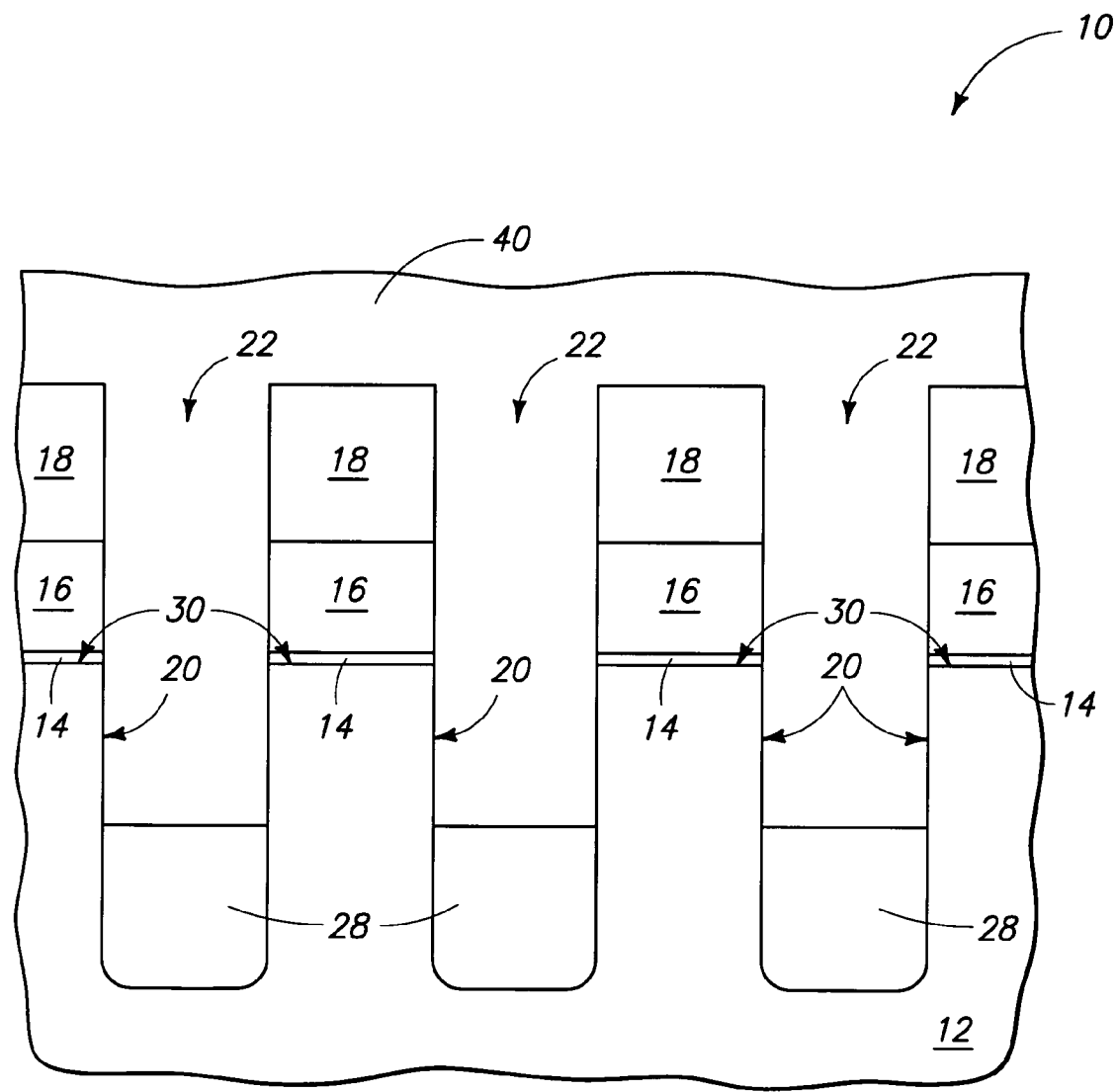
FIG. 8 is a view of the FIG. 7 substrate at a processing subsequent to that depicted by FIG. 7.

Referring to FIG. 8, dielectric material 40 has been deposited over dielectric inner portion 28 to within isolation trenches 22. In the depicted exemplary and preferred embodiment, such depositing is effective to fill and overfill the remaining volume of trenches 22. Typically and preferably, dielectric material 40 will be some material different in composition from that of material 24 and have complementary and/or preferred dielectric or other attributes to that of remaining material 28. Dielectric material 40 might also comprise one or more dielectric materials and/or dielectric layers. An exemplary preferred material is high density plasma deposited oxide.

Figure 9:
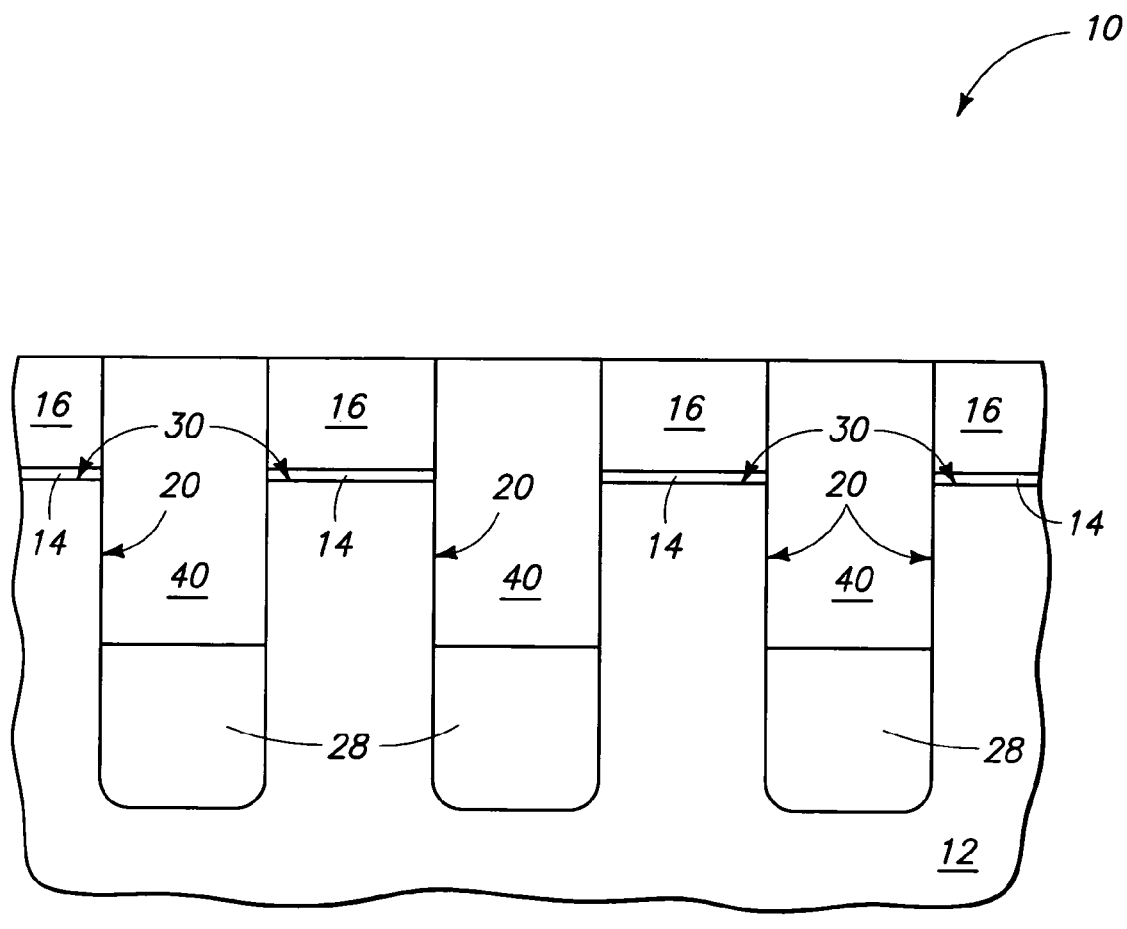
FIG. 9 is a view of the FIG. 8 substrate at a processing subsequent to that depicted by FIG. 8.

Referring to FIG. 9, trench isolation masking material 18 has been removed from over floating gate material 16. By way of example only, an exemplary preferred technique is one or a combination of timed chemical etching, and/or selective etching, and/or chemical-mechanical polishing.

The depicted preferred embodiment shows forming gate dielectric material and floating gate material over the semiconductor substrate prior to providing isolation trenches 22. Alternately but less preferred, such could be provided later (or not at all). Further and regardless, dielectric material 24 might be provided before or after the removal of trench isolation masking material 18 where such is utilized at least in part to form isolation trenches 22.

Figure 10:
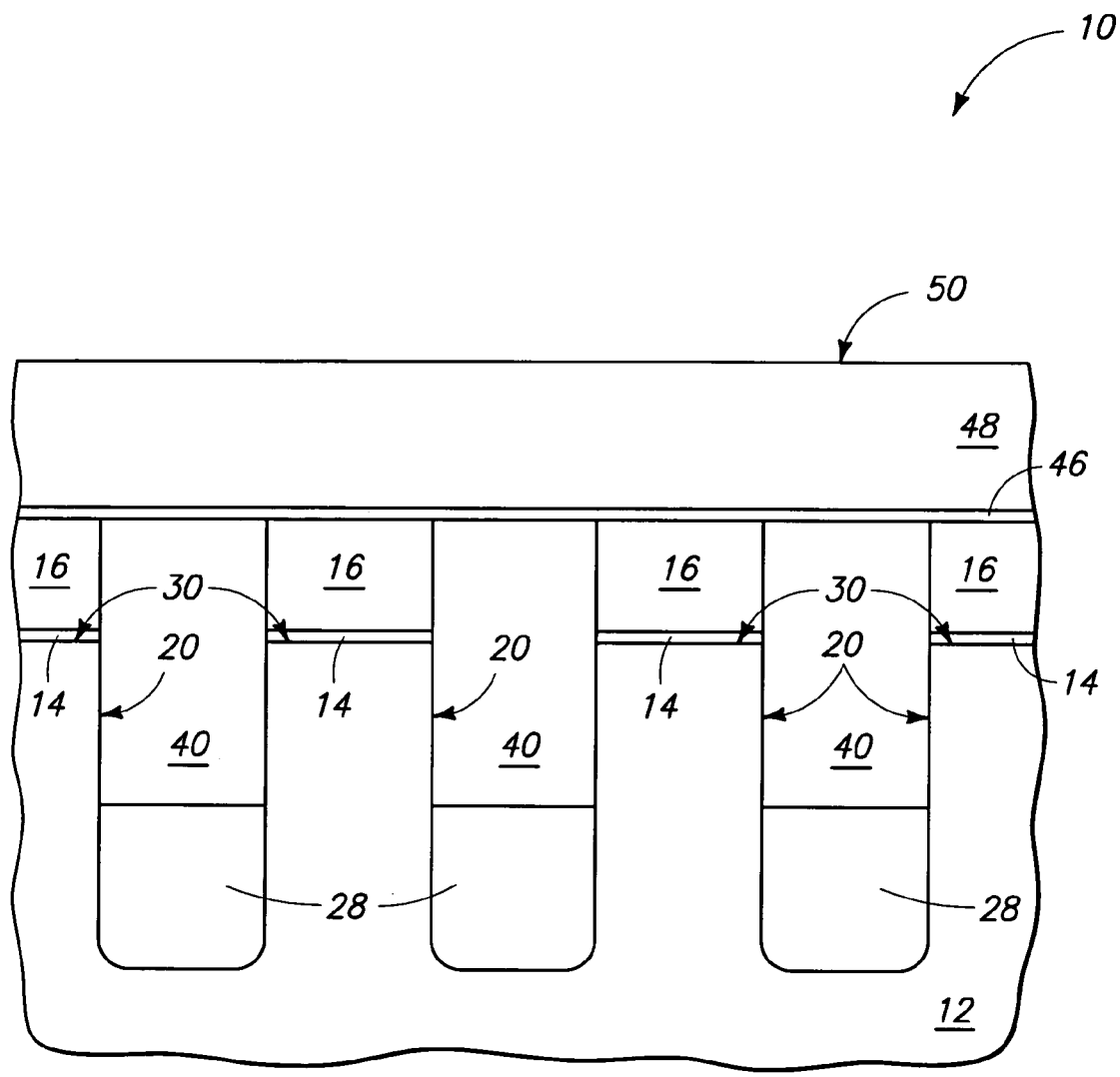
FIG. 10 is a view of the FIG. 9 substrate at a processing subsequent to that depicted by FIG. 9.

Referring to FIG. 10, control gate dielectric material 46 and control gate material 48 have been formed over floating gate material 16, and preferably patterned into exemplary control gate wordlines 50. Insulating material might be provided thereover before and/or after patterning. In one preferred implementation, and as described briefly above, the exemplary depicted floating gate wordlines might comprise floating gate transistors of NAND unit cells of an array of NAND memory circuitry intermediate adjacent pairs of isolation trenches. For example and by way of example only, FIG. 11 schematically depicts exemplary NAND circuitry comprising wordlines 50, a source line 52, a bitline 54 and an exemplary unit memory cell 56 of exemplary existing NAND memory circuitry, although alternate or yet-to-be developed NAND and other circuitry are also, of course, contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming trench isolation, comprising:
   providing isolation trenches within a semiconductor substrate;
   depositing and solidifying a liquid within the isolation trenches to form a solidified dielectric within the isolation trenches, the solidified dielectric comprising carbon and silicon, the solidified dielectric comprising an elevationally outer portion and an elevationally inner portion within the isolation trenches;
   removing carbon from the outer portion of the solidified dielectric and not from the inner portion of the solidified dielectric to form the inner and outer portions to be of different compositions;
   after the removing, using the different compositions of the inner and outer portions in etching the solidified dielectric outer portion selective to and effective to expose the solidified dielectric inner portion, the solidified dielectric inner portion being retained;
   after the etching, depositing dielectric material over the solidified dielectric inner portion to within the isolation trenches; and
   forming floating gate transistors of NAND unit cells of an array of NAND memory circuitry intermediate adjacent pairs of the isolation trenches.

2. The method of claim 1 wherein carbon content in the solidified dielectric is from 5 atomic percent to 70 atomic percent.

3. The method of claim 1 wherein silicon content in the solidified dielectric is from 10 atomic percent to 90 atomic percent.

4. The method of claim 1 wherein carbon content in the solidified dielectric is from 20 atomic percent to 40 atomic percent, and silicon content in the solidified dielectric is from 30 atomic percent to 40 atomic percent.

5. The method of claim 1 wherein the liquid comprises at least one of nitrogen and oxygen.

6. The method of claim 1 wherein the liquid comprises an organosiloxane.

7. The method of claim 1 wherein the liquid comprises a silicate polymer.

8. The method of claim 1 wherein carbon is removed from said outer portion to leave no more than 5 atomic percent carbon in said outer portion.

9. The method of claim 1 wherein the removing also oxidizes said outer portion.

10. The method of claim 1 wherein the removing comprises exposure to an oxygen-containing material.

11. The method of claim 1 wherein the removing comprises exposure to an oxygen-containing plasma.

12. The method of claim 1 wherein the semiconductor substrate comprises semiconductive material having an outermost surface the outer portion from which carbon is removed being from 50 Angstroms to 3,000 Angstroms deep within said semiconductor substrate relative to said outermost surface.

13. The method of claim 1 wherein the etching comprises wet etching.

14. The method of claim 1 wherein the etching comprises dry etching.

15. The method of claim 1 wherein the etching the solidified dielectric outer portion selective to the solidified dielectric inner portion is at a selectivity ratio of at least 5:1 upon exposure of the solidified dielectric inner portion.

16. The method of claim 1 wherein the etching the solidified dielectric outer portion selective to the solidified dielectric inner portion is at a selectivity ratio of at least 100:1 upon exposure of the solidified dielectric inner portion.

17. The method of claim 1 comprising forming gate dielectric material and floating gate material over the semiconductor substrate prior to depositing said liquid.

18. The method of claim 1 comprising forming gate dielectric material and floating gate material over the semiconductor substrate prior to providing the isolation trenches.

19. The method of claim 1 comprising after the etching and before the depositing of the dielectric material, removing carbon from the inner portion of the solidified dielectric.

20. The method of claim 1 wherein the etching comprises wet etching with an aqueous HF-comprising solution.

21. A method of forming trench isolation, comprising:
providing isolation trenches within a semiconductor substrate
depositing and solidifying a liquid within the isolation trenches to form a solidified dielectric within the isolation trenches, the solidified dielectric comprising carbon and silicon, the solidified dielectric comprising an elevationally outer portion and an elevationally inner portion within the isolation trenches;
removing carbon from the outer portion of the solidified dielectric;
after the removing, etching the solidified dielectric outer portion selective to and effective to expose the solidified dielectric inner portion, the solidified dielectric inner portion being retained;
after the etching, removing carbon from the inner portion of the solidified dielectric; and
after the etching and after removing carbon from the inner portion of the solidified dielectric, depositing dielectric material over the solidified dielectric inner portion to within the isolation trenches.

22. The method of claim 21 wherein carbon is removed from said inner portion to leave no more than 5 atomic percent carbon in said inner portion.

23. The method of claim 21 wherein carbon is removed from said inner portion to leave no more than 2.5 atomic percent carbon in said inner portion.

24. The method of claim 21 wherein carbon is removed from said inner portion to leave no more than 1.0 atomic percent carbon in said inner portion.

25. The method of claim 21 wherein carbon is removed from said inner portion to leave no more than 0.5 atomic percent carbon in said inner portion.

26. The method of claim 21 wherein no detectable carbon remains in said inner portion after said removing of carbon from said inner portion.

27. A method of forming trench isolation comprising: providing isolation trenches within a semiconductor substrate;
depositing and solidifying a liquid within the isolation trenches to form a solidified dielectric within the isolation trenches, the solidified dielectric comprising carbon and silicon, the solidified dielectric comprising an elevationally outer portion and an elevationally inner portion within the isolation trenches;
oxidizing the outer portion of the solidified dielectric and not the inner portion of the solidified dielectric to form the inner and outer portions to be of different compositions;
after the oxidizing, using the different compositions of the inner and outer portions in etching the solidified dielectric outer portion selective to and effective to expose the solidified dielectric inner portion, the solidified dielectric inner portion being retained;
after the etching, depositing dielectric material over the solidified dielectric inner portion to within the isolation trenches; and forming floating gate transistors of NAND unit cells of an array of NAND memory circuitry intermediate adjacent pairs of the isolation trenches.

28. The method of claim 27 comprising after the etching and before the depositing of the dielectric material, removing carbon from the inner portion of the solidified dielectric.

29. A method of forming trench isolation comprising: providing isolation trenches within a semiconductor substrate;
depositing and solidifying a liquid within the isolation trenches to form a solidified dielectric within the isolation trenches, the liquid comprising an organosiloxane, the solidified dielectric comprising an elevationally outer portion and an elevationally inner portion within the isolation trenches;
removing carbon from the outer portion of the solidified dielectric and oxidizing the outer portion of the solidified dielectric while not removing carbon from the inner portion of the solidified dielectric and while not oxidizing the inner portion to form the inner and outer portions to be of different compositions, the removing and oxidizing comprising exposure to an oxygen-containing material, the carbon being removed from said outer portion to leave no more than 1.0 atomic percent carbon in said outer portion;
after the removing and the oxidizing, using the different compositions of the inner and outer portions in etching the solidified dielectric outer portion selective to and effective to expose the solidified dielectric inner portion using an aqueous HF-comprising solution, the solidified dielectric inner portion being retained;
after the etching, removing carbon from the inner portion of the solidified dielectric to leave no more than 1.0 atomic percent carbon in said inner portion; and
after removing carbon from the inner portion, depositing dielectric material over the solidified dielectric inner portion to within the isolation trenches.

30. A method of forming an array of FLASH memory cells, comprising:
forming a gate dielectric over a semiconductor substrate;
forming floating gate material over the gate dielectric;
forming trench isolation masking material over the floating gate material;
forming a series of alternating active area rows and isolation trenches using the trench isolation masking material as a mask, said active area rows having said gate dielectric and floating gate material thereover;
depositing and solidifying a liquid within the isolation trenches to form a solidified dielectric within the isolation trenches, the liquid comprising an organosiloxane, the solidified dielectric comprising carbon and silicon, the solidified dielectric comprising an elevationally outer portion and an elevationally inner portion within the isolation trenches removing carbon from the outer portion of the solidified dielectric and oxidizing the outer portion of the solidified dielectric and while not removing carbon from the inner portion of the solidified dielectric and while not oxidizing the inner portion to form the inner and outer portions to be of different compositions, the removing and oxidizing comprising exposure to an oxygen-containing material, the carbon being removed from said outer portion to leave no more than 1.0 atomic percent carbon in said outer portion;

after the removing and the oxidizing, using the different compositions of the inner and outer portions in etching the solidified dielectric outer portion selective to and effective to expose the solidified dielectric inner portion using an aqueous HF-comprising solution, the solidified dielectric inner portion being retained;

after the etching, removing carbon from the inner portion of the solidified dielectric to leave no more than 1.0 atomic percent carbon in said inner portion;

after removing carbon from the inner portion, depositing dielectric material over the solidified dielectric inner portion to within the isolation trenches;

removing the trench isolation masking material from over the floating gate material; and after removing the trench isolation masking material, forming control gate dielectric material and control gate material over the floating gate material.

* * * * *

UNITED STATES PATENT AND TRADEMARK OFFICE
CERTIFICATE OF CORRECTION

PATENT NO. : 7,682,977 B2  Page 1 of 2
APPLICATION NO. : 11/433324
DATED : March 23, 2010
INVENTOR(S) : Li Li It is certified that error appears in the above-identified patent and that said Letters Patent is hereby corrected as shown below:

In column 7, line 5, in Claim 12, delete "surface" and insert -- surface, --, therefor.

In column 7, line 34, in Claim 21, delete "substrate" and insert -- substrate; --, therefor.

In column 8, line 1-22, in Claim 27, delete "A method of forming trench isolation comprising: providing isolation trenches within a semiconductor substrate;
depositing and solidifying a liquid within the isolation trenches to form a solidified dielectric within the isolation trenches, the solidified dielectric comprising carbon and silicon, the solidified dielectric comprising an elevationally outer portion and an elevationally inner portion within the isolation trenches;
oxidizing the outer portion of the solidified dielectric and not the inner portion of the solidified dielectric to form the inner and outer portions to be of different compositions; after the oxidizing, using the different compositions of the inner and outer portions in etching the solidified dielectric outer portion selective to and effective to expose the solidified dielectric inner portion, the solidified dielectric inner portion being retained;
after the etching, depositing dielectric material over the solidified dielectric inner portion to within the isolation trenches; and forming floating gate transistors of NAND unit cells of an array of NAND memory circuitry intermediate adjacent pairs of the isolation trenches." and
insert -- A method of forming trench isolation, comprising: providing isolation trenches within a semiconductor substrate;
depositing and solidifying a liquid within the isolation trenches to form a solidified dielectric within the isolation trenches, the solidified dielectric comprising carbon and silicon, the solidified dielectric comprising an elevationally outer portion and an elevationally inner portion within the isolation trenches;
oxidizing the outer portion of the solidified dielectric and not the inner portion of the solidified dielectric to form the inner and outer portions to be of different compositions; after the oxidizing, using the different compositions of the inner and outer portions in etching the solidified dielectric outer portion selective to and effective to expose the solidified dielectric inner portion, the solidified dielectric inner portion being retained;
after the etching, depositing dielectric material over the solidified dielectric inner portion to within the isolation trenches; and

Signed and Sealed this

Eighth Day of June, 2010

David J. Kappos
*Director of the United States Patent and Trademark Office* forming floating gate transistors of NAND unit cells of an array of NAND memory circuitry intermediate adjacent pairs of the isolation trenches. --, therefor.

In column 8, line 26, in Claim 29, delete "isolation" and insert -- isolation, --, therefor.

In column 9, line 5, in Claim 30, delete "trenches" and insert -- trenches; --, therefor.